United States Patent [19]

Dreibelbis et al.

[11] Patent Number: 4,586,642

[45] Date of Patent: May 6, 1986

[54] WIRE BOND MONITORING SYSTEM

[75] Inventors: John D. Dreibelbis, Chalfont; I. Marvin Weilerstein, Philadelphia, both of Pa.

[73] Assignee: Kulicke and Soffa Industries Inc., Horsham, Pa.

[21] Appl. No.: 733,310

[22] Filed: May 13, 1985

[51] Int. Cl.[4] ............................................. B23K 20/00
[52] U.S. Cl. ........................................ 228/4.5; 228/9; 228/104
[58] Field of Search ................... 228/4.5, 9, 103, 104; 324/61 QS; 340/664

[56] References Cited

U.S. PATENT DOCUMENTS

| | | | |
|---|---|---|---|
| 3,192,474 | 6/1965 | Cherry | 29/593 |
| 3,302,277 | 2/1967 | Pruden et al. | 228/56.5 X |
| 3,763,545 | 10/1973 | Spaujer | 228/102 X |
| 4,213,556 | 7/1980 | Persson et al. | 228/104 |
| 4,373,653 | 2/1983 | Salzer et al. | 228/56.5 X |

FOREIGN PATENT DOCUMENTS

| | | | |
|---|---|---|---|
| 24403 | 2/1980 | Japan | 228/103 |
| 48946 | 4/1980 | Japan | 228/4.5 |
| 165334 | 12/1981 | Japan | 228/103 |
| 197712 | 12/1977 | U.S.S.R. | 228/8 |
| 733923 | 5/1980 | U.S.S.R. | 228/9 |
| 996140 | 2/1983 | U.S.S.R. | 228/103 |

Primary Examiner—Nicholas P. Godici
Assistant Examiner—Carmine Cuda
Attorney, Agent, or Firm—John B. Sowell

[57] ABSTRACT

Apparatus is provided for monitoring conditions of a fine wire interconnection during a bonding operation. The apparatus comprise a system which is capable of being installed on new automatic wire bonders or retrofitted into existing automatic wire bonders of the type which employ a main bonding processor for controlling the motion of the bonding tool. The semiconductor to be bonded is connected to a reference voltage and a variable frequency oscillator is magnetically or a.c. coupled to the fine wire above the bonding tool and below the wire feed. The bonding wire incurs changes in inductive and capacitive reactance during the bonding operation which cause variations in the frequency of the oscillator. A series of frequency samples are taken and recorded during a teaching operation in which good wire bond interconnections are made. The recorded frequency samples for each fine wire interconnection are compared to the frequency samples being taken during subsequent bonding operations and decisions are made at critical points of the bonding operation whether or not a good wire bond interconnection is being made without damaging the semiconductor device with excessive force or current.

11 Claims, 10 Drawing Figures

WIRE BOND MONITORING SYSTEM

BACKGROUND OF THE INVENTION

1. Field of the Invention

The present invention relates to a system for monitoring the conditions of a fine wire bonded interconnection and more particularly to a monitoring system for incorporation into a high-speed, automatic wire bonder so that continuous operator attention is not required on each automatic wire bonder.

2. Description of the Prior Art

Automatic wire bonders are known in the semiconductor manufacturing industry. A commercially available processor controlled automatic wire bonder is made by Kulicke and Soffa Industries, Inc. and is shown and described in U.S. Pat. No. 4,266,710. The wedge bonding mechanism for an automatic wedge wire bonder also commercially available from Kulicke and Soffa Industries, Inc. is shown and described in U.S. Pat. No. 4,239,144.

Heretofore, it was common practice to assign an attendant to one or more automatic wire bonders. These high-speed wire bonders complete an interconnection of fine wire between a first and second bond position in approximately 250 milliseconds. If the fine wire breaks and/or is not properly fed from the wire feed to the bonding tool, a tail of proper length is not positioned below the working face of the bonding tool to permit a proper bonding operation on the next bond. Numerous problems occur which can cause a wire to be missing from the working face of a bonding tool. In addition, other problems occur which cause the first or second bond to be made improperly or to become disconnected from the pad or terminal on which it is made. If the attendant responsible for an automatic wire bonder is responsible for detecting the numerous errors which can and do occur, a large number of semiconductor devices could be processed or operated on by the automatic wire bonder before the attendant could shut the machine down. After making the first error, the bonding tool can continue to attempt to make bonds at the first and second bond position without making a good wire interconnection. If the ball or tail is missing from the end of the wire under the working face of a bonding tool when the bonder attempts to make a subsequent first and second bond, the bonding tool can crash into the terminal pads on the semiconductor device and/or destroy the lead out pads especially when ultrasonic scrubbing is employed to speed up the bonding operation. Ultrasonic scrubbing of pads and terminals with a bare bonding tool will damage the electrodes.

Attempts have been made to monitor the condition of a bond at the time it is being made by an ultrasonically driven bonding tool. The prior art devices have monitored the drive current as well as the impedance of the bonding transducer to determine if the bonds being made by the bonding tool are properly attached to the terminals or pads. Through a complex analysis of the changes in impedance relative to the bonding time such prior art systems have been able to determine with some accuracy whether the first and/or second bond was properly made. However, such prior art bond monitors did not monitor whether the first bond subsequently became detached or whether the fine wire interconnection between the first and second bond broke or was made improperly. U.S. Pat. Nos. 4,341,574 and 3,852,999 are typical of systems which measure the impedance of the transducer to determine if the bonds are properly attached to the terminals or pads.

Heretofore the conductance of a fine wire interconnection has been measured during a complete bonding operation. However, heretofore the systems employed for monitoring a bonding operation have employed a DC voltage source which has been applied to the fine wire. The prior art systems included some means for measuring current changes in the fine wire. This required that the fine wire be insulated or isolated at the wire feed and that the fine wire be grounded at the semiconductor or the work station. The bonding tool and wire feed were insulated so that the current path from the voltage source was directed through the fine wire to the pad or electrode on the device to ground. Some devices required that the conductive path be reversed so that current would flow through the semiconductor device being tested. If the voltage source of the prior art conductive devices could be made stable, changes in the current observed were proportional to the impedance of the fine wire plus the impedance of the device being bonded which includes capacitive and resistive components. These prior art systems would ground the fine wire by making contact to the semiconductor device and providing a path to ground. In these prior art systems the first bond and the second bond must be grounded and problems that occur in sensing the interconnection after the first bond become extremely difficult with conductive impedance measuring instruments or current sensing devices. Attempts to raise the voltage or current in the fine wire to generate larger current flow so as to provide larger values for detection quite often become harmful to the device and can cause destruction of the more sensitive devices. Since some electrodes or pads on the devices are more sensitive than others, it was necessary to shut off or disconnect the monitoring system to prevent damage to some devices. The gates of field effect transistors (FETs) have very high impedance and can be easily destroyed with small amounts of current. Other devices having high impedance cannot be properly tested due to very small current changes induced into the prior art conductive monitoring systems. CMOS devices have a very small input capacitance and are easily destroyed if current and voltage sources are raised too high. Other types of devices cannot be tested without reversing the polarity of the current flow. When the device under test presents a high capacitive time constant, the device can continue to charge after the first bond is made and create false indications of bad bonds due to decaying current flow. Any speed-up of detection before the device and circuit is fully charged is a compromise which could easily fail to detect some types of improper fine wire interconnections.

Applicants concluded it would be extremely desirable to provide a wire bond monitoring system that would continue to monitor a fine wire interconnection being made between a first and second band without diminishing its sensitivity in any way. Such a monitor would be commercially desirable if it would work on all types of semiconductor devices without having to change the voltage source or current source settings for different types of devices and would not have to avoid certain terminals on the semiconductor device or to employ manually selectable switches to provide reverse polarity. Such a wire bond monitor would be extremely desirable if it was inexpensive and simplified and structured so as to be incorporated into existing automatic wire bonders without requiring modifications which would change the mode of operation on automatic wire bonders. Further, it would be desirable if the wire bond monitor would provide a miniaturized structure which could be easily incorporated into the existing automatic wire bonders and would not be affected by thermal changes and vibrations of the bonding transducer or rapid movement of the bonding head.

SUMMARY OF THE INVENTION

It is the principal object of the present invention to provide a novel wire bond monitoring system for detecting bad fine wire interconnections between a first and second bond.

It is another principal object of the present invention to provide a novel wire bond monitoring system that operates on all types of semiconductor devices.

It is another principal object of the present invention to provide a novel wire bond monitoring system that detects changes in inductive reactance as well as capacitive reactance which occur when a fine wire is connected between a first and a second bond.

It is another principal object of the present invention to provide a wire bond monitoring system which will detect errors which occur in fine wire interconnections without variations in sensitivity.

It is a general object of the present invention to provide a novel wire bond monitoring system for accurately sensing fine wire interconnections on different types of semiconductor devices without requiring manual changes and adjustments.

It is another general object of the present invention to provide a wire bond monitoring system that can be coupled electrically to a fine wire without imposing drag forces on the fine wire which could affect bonding operations.

It is another general object of the present invention to provide a miniature transformer for coupling high frequency electromagnetic field forces to a fine wire to provide a means for sensing inductive and capacitive reactive changes in the fine wire during bonding operations which permit the use of a grounded wire feed and multilayered wires on the wire spool.

It is yet another object of the present invention to provide a miniature sensing system for a fine wire monitoring system for sensing inductive and capacitive reactance changes of very small amounts that permit monitoring a fine wire innerconnection during a bonding operation.

It is yet another object of the present invention to provide a fine wire monitoring system provided with detector means programmable to stop an automatic wire bonder during a single bonding cycle operation.

According to these and other objects of the present invention, there is provided a wire bond monitoring system having a high frequency alternating current oscillator coupled to the fine wire intermediate the wire feed and the semiconductor device to be bonded. The semiconductor device and the wire feed are grounded (or a.c. coupled to ground) to provide an electrical return path through the fine wire. The oscillator frequency may be monitored so that only the capacitive and inductive reactances changes of the fine wire and the semiconductor device being bonded are monitored. The frequency changes of the high frequency oscillator are sampled and compared with digital data representations of previously made good fine wire interconnections. Deviations from predetermined digital data representations of good interconnections are employed to stop the automatic wire bonder during a bonding operation and to display the probable cause or problem and/or to suggest the solution.

DESCRIPTION OF THE PREFERRED EMBODIMENT

Before explaining in detail the drawings showing the preferred embodiment wire bond monitor, it is to be understood that the present invention is operable with thermocompression wire bonders but is now used in association with an automatic ultrasonic wire bonder of the type employed to make gold wire interconnections or aluminium wire interconnections between pads and electrodes on semiconductor devices. Such automatic wire bonders are well known in the art such as a Model 1482 automatic wire bonder presently made and sold by Kulicke and Soffa Industries, Inc. in Horsham, PA.

While the preferred embodiment of the present invention is explained in detail with reference to capillary type bonding tools, it is to be understood that ultrasonic wedge wire bonders such as a Model 1470 automatic wire bonder made and sold by Kulicke and Soffa Industries, Inc. are also applicable to the present wire bond monitoring system.

Figure 1:
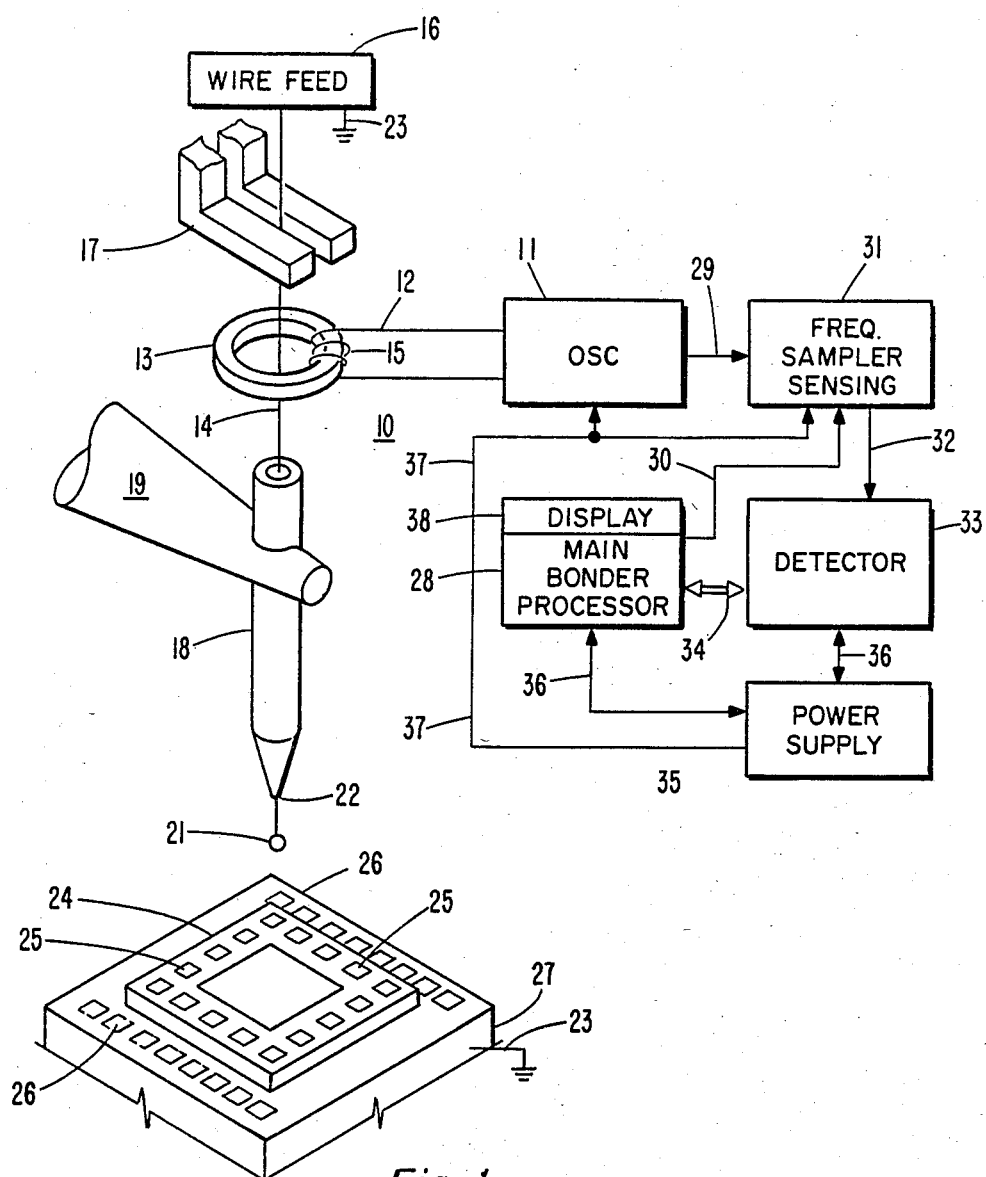
FIG. 1 is a schematic block diagram of an ultrasonic transducer and capillary wire bonding tool of an automatic wire bonder having a preferred embodiment wire bond monitoring system coupled to the fine wire used for making bonds.

Refer now to FIG. 1 showing a wire bond monitoring system 10 which comprises an alternating current (a.c.) oscillator 11 inductively coupled by a primary winding 15 to a toroidal ferrite core 13 for inducing peak-to-peak voltages in fine wire 14 of the order of 150 millivolts. Such voltages have been found to generate currents less than 10 microamps in fine wire 14 when the devices being bonded provide capacitive reactances of the order of two picofarads. The oscillator 11 is a standard commercially available ECL oscillator chosen to provide a very stable output over short periods of time. The primary winding 15 inherently includes capacitive and inductive reactance in the winding and does not require a shunt or dissipative capacitance across the parallel leads 12. Some forms of oscillators may require a shunt capacitance across the winding 12. The toroidal core 13 acts as a sense transformer to reflect the impedance of the fine wire 14 into the tank circuit of oscillator 11 which changes the resonant frequency. The frequency of the oscillator is equal to $1/(2\pi\sqrt{LC}) = f$ where frequency is in hertz, L is in henrys and C is in farads. The capacitance C includes the capacitance of the cable from the transformer to the oscillator plus the transformer and the interwinding capacitance plus the capacitance that was reflected through the transformer from the bonding wire 14. The inductance L of the transformer includes the winding 15 plus the inductance reflected through the transformer from the bonding wire 14. Wire feed 16 provides a control source of fine wire which is threaded between wire clamps 17 of the automatic wire bonder. The fine wire is threaded through the core 13 which acts as a transformer and is further threaded through a capillary bonding tool 18 held in the ultrasonic transducer 19 of the type employed in automatic ball wire bonders. The ball 21 on wire 14 is shown extended from the working face 22 of an insulated capillary 18. In the preferred embodiment shown in FIG. 1, the wire feed 16 is grounded at connection 23. The semiconductor device 24 to be wire bonded is provided with pads or electrodes 25 which are to be connected to the lead out pads or terminals 26 on the carrier or substrate 27. The supporting carrier 27 is shown being grounded at connection 23. When the ball 21 of wire 14 is bonded at the first bond connection on a pad 25, the grounded connections provide a return path through ground 23 on semiconductor 24 to wire feed 16. Thus, fine wire 14 is electrically a single turn wire on the core 13 which acts as a transformer to inductively couple its capacitance back into the tank circuit of oscillator 11.

A first and second bond forming an interconnection between pads or electrodes 25 and 26 may be made in less than 250 miliseconds. If some problem occurs in making the interconnection, it is desirable that the wire bonding operation cease immediately before a second wire bonding cycle starts and preferably before any ultrasonic energy is applied to the bonding tool 18 which would cause damage to the semiconductor device 24 or the pads 25 or 26. Before starting the bonding operation the reference frequency in free air of the oscillator 11 is established. In the preferred embodiment an average frequency of 60 megahertz may be employed with variations between 55 and 75 megahertz. The reference frequency of the oscillator 11 is polled four times over a period of approximately 250 microseconds each. After the reference frequency is established, the average is stored in detector 33. The output from oscillator 11 is frequency modulated during a bonding operation. The variable frequency on line 29 is sampled by frequency sampler 31. The sensed frequency count is digitized on line 32 and presented to detector 33 in digital form. The digital frequency output from detector 33 is presented on bus 34 to the main bonder processor 28. Since the detector 33 is preferable a microprocessor with a memory for converting sample counts to digital information, the function of detector 33 could be embodied into the main bonder processor 28. However, this could embody more expensive modifications than employing a microprocessor detector 33. A power supply 35 is provided in the automatic wire bonder and shown connected via lines 36 and 37 to the automatic wire bonder processor 28 and frequency sampler 31. Frequency sampler 31 and detector 33 are timed by processor 28 via line 30 and bus 34.

Before explaining in detail how the wire bond monitor 10 is programmed to operate, it will be understood that the time of operation of the bonding cycle is already stored in the main bonder processor 28 and that the vertical position of the capillary bonding tool 18 is also stored in the main bonder processor 28. Thus, at any time during a bonding operation, digital information stored in the memory of main bonder processor 28 is capable of describing whether the bonding capillary 18 is in a position just prior to touching the bonding pads 25 or 26 and which phase of the bonding operation is being conducted. A visual display 28 is provided on the main bonder processor and can also be used for indicating visual data or noise alarms.

Figure 2:
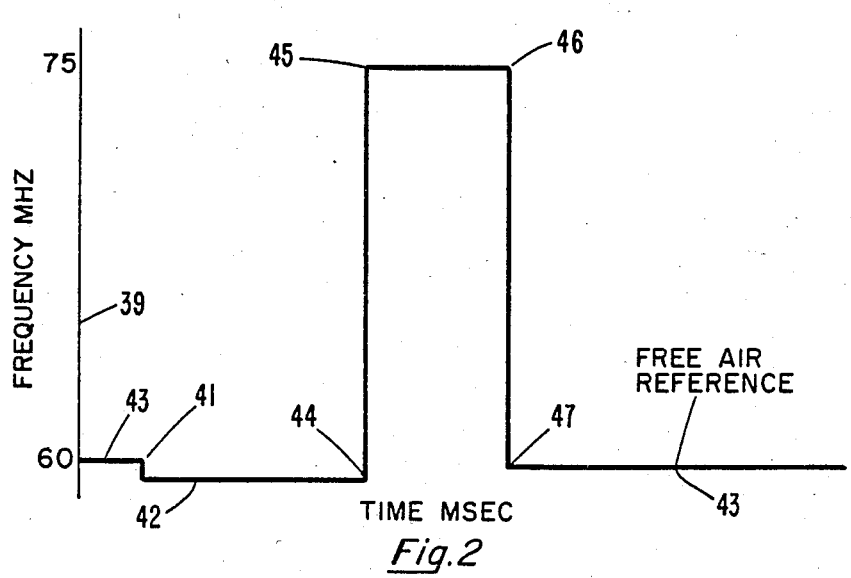
FIG. 2 is a curve of frequency versus time showing frequency changes which occur in, and are detected by the present system during a bonding operation in which a fine wire interconnection is made.

When the ball 21 on the end of wire 14 is suspended in free air, it causes the oscillator 11 to operate at a base or reference free air frequency which is shown as the base line 43 in FIG. 2. This free air reference frequency is established by several pollings before any bonding operation is conducted. Assume that the automatic wire bonder (not shown) has been employed in a teaching mode so as to bond the semiconductor 24 to its correct lead-out terminals 26 and that all of the bonds and interconnections were made properly. This information is stored in the main bonder processor 28 along with the information necessary to cause the automatic wire bonder to repeat the complete series of wire bonding interconnection operations on other similiar semiconductor devices 24 in an automatic mode of operation. Assume now that the frequency sampler 31 is monitoring the frequency of the oscillator 11 and continues to present this information periodically on line 32 to detector 33 and from detector 33 over bus 34 to main bonder processor 28.

Refer now to FIG. 2 showing a curve of frequency versus time of the type which would be monitored during a good wire bonding operation. Base line 39 represents the time of starting a bonding operation when the ball 21 and fine wire 14 are positioned over a pad 25 and the capillary 18 is descending to engage ball 21 with its working face 22 prior to engaging the ball 21 on pad 25. Point 41 represents the point in time at which ball 21 of wire 14 engages pad 25 and senses an increase in capacitance of the semiconductor device 24. This causes the frequency of oscillator 11 to shift to reference line 42 from the free air reference line 43. After the contact is made at point 41, ultrasonic power is applied to bonding tool 18 to complete the bond. The bonding tool 18 is raised from the first bond position to pay out a length of wire and to form a loop to the second bond position. All during the first bond operation and the looping operation, detector 33 is supplying frequency information on bus 34 to main bonder processor 28 which is comparing the information stored in memory of the main bonder with information stored during the teaching operation. If all goes well, the bonding tool 18 proceeds downward after looping to the second bond so as to attach the looped fine wire to a lead out pad 26 on carrier 27. The time of contact at second bond is shown at point 44 at which time the the looped fine wire 14 is directly shorted to ground so as to bypass the capacitance of the semiconductor device 24. The inductive and capacitive reactance of the primary loop wire 14 is now grounded or shunted so as to reduce the L and C components in the denominator of the frequency calculation. The frequency rises to point 45 representative of the second bond. The initial portion of the second bond includes a portion where ultrasonic power is applied to cause the fine wire to be bonded to the lead-out terminal 26. The bonding tool 18 then ascends allowing a length of fine wire to pay out of the capillary 18 representative of a proper length of tail required to make a new ball 21. At the proper ascent height the clamp 17 is articulated or actuated so as to clamp the wire and start the tearing or breaking operation which preferably severs the wire at the weakened portion of the second bond. When the wire breaks as shown at point 46, the connection to ground is also severed and the frequency of oscillator 11 again drops to the free air reference line 43 as shown at point 47. The remainder of the cycle is concerned with the making of a new ball and positioning the bonding tool 18 to the correct height and position to start a new bonding operation.

Figure 3:
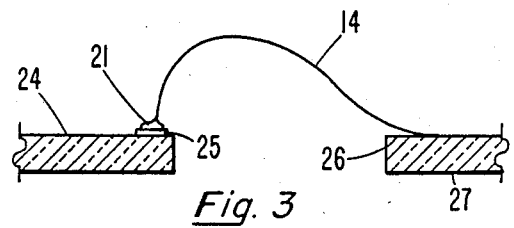
FIG. 3 is a schematic drawing of a good fine wire interconnection between a pad or terminal on a semiconductor and a lead out pad or terminal.

FIG. 3 schematically shows a good interconnection of fine wire 14 between the ball 21 at first bond on pad 25 of semiconductor 24 and pad 26 of carrier 27. A curve of the type shown in FIG. 2 would be produced during this bonding operation.

Figure 4:
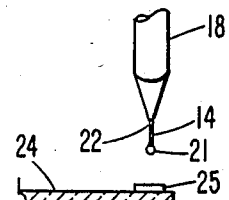
FIG. 4 is a schematic drawing of a fine wire which improperly extends from the wire guide and working face of a bonding tool.

Refer now to FIG. 4 showing the ball 21 of wire 14 extended excessively below the working face 22 of bonding tool 18 just before touch down on pad 25 of semiconductor 24. When the ball 21 contacts pad 25 prematurely, there will be premature sensing of increased capacitance and the frequency of oscillator 11 will drop to the reference line 42 prior to reaching point 41 as shown in FIG. 2. Depending on the type of device being bonded and what caused the extension of the ball 21 from the bonding tool 18, there may be a bending of the wire so that the ball 21 does not properly seat in the working face 22 of bonding tool 18. It is best to stop the operation and display on the panel 38 the cause of this problem which should be remedied before proceeding with high speed bonding operations.

Figure 5:
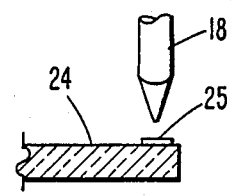
FIG. 5 is a schematic drawing of a capillary bonding tool having a missing ball and/or wire extending below the working face of the bonding tool.

Refer to FIG. 5 showing bonding tool 18 just prior to contacting pad 25 of semiconductor 24 when no ball 21 is present. At point 41 of FIG. 2 when tool 18 contacts the pad 25, the expected drop to the lower frequency reference line 42 does not occur, thus, indicating that a wire is missing under the working face of the bonding tool 18. Remedial measures can be shown on display 38. The bonding machine is immediately shut down to prevent the bonding tool 18 from scrubbing pad 25 and proceeding to apply forces which could destroy the device 24.

Figure 6:
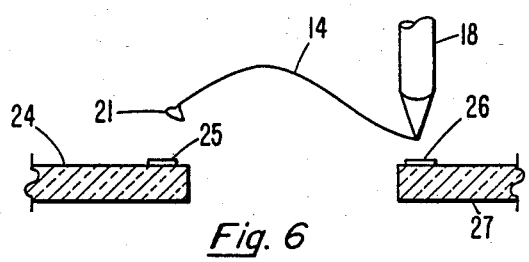
FIG. 6 is a schematic drawing of a capillary bonding tool at second bond position showing the fine wire disconnected from the first bond.

Refer now to FIG. 6 showing the bonding tool 18 just prior to contacting terminal 26 at the second bond operation. Ball 21 on wire 14 has torn loose from pad 25 of semiconductor 24 and the bonding tool 18 has not reached the point in time shown at point 44 of FIG. 2. The wire 14 is now suspended in free air and the frequency of oscillator 11 has returned to the free air reference line 43. When this condition occurs, the main bonder processor 28 immediately stops the bonding operation because the interconnect wire 14 has either become detached at the first bonding pad 25 or has been broken between first and second bond. In either event, operator attention is required to prepare the automatic wire bonder for continuing operations.

Figure 7:
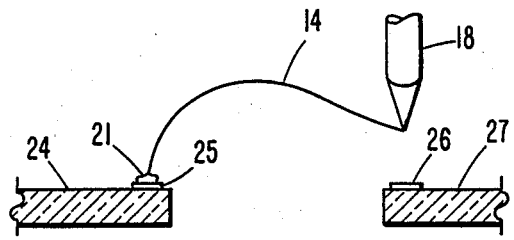
FIG. 7 is a schematic drawing of a capillary bonding tool at second bond position showing the second bond disconnected from the bonding pad.

Refer to FIG. 7 showing a good first bond on semiconductor 24 and a condition where the bonding tool 18 and fine wire 14 both rise to the clamp position but the second bond connection on pad 26 of carrier 27 is detached. As explained with regards to FIG. 2, there is a ground connection at second bond points 45 and 46 which cause a substantial increase in frequency. Severing the second bond connection, as shown in FIG. 7, will cause the frequency of oscillator 11 to drop to a frequency line approximately equal to the reference line 42 representative of the frequency at first bond. When this condition is detected by main bonder processor 28, the automatic wire bonder is immediately shut down and the operator must attempt to make a proper second bond if possible or finish the other fine wire interconnections on the other pads and terminals and send this semiconductor 24 back for rework.

Figure 8:
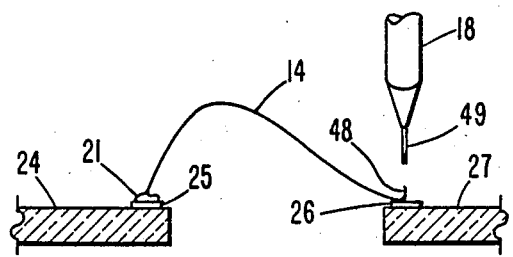
FIG. 8 is a schematic drawing of a capillary bonding tool after the second bond has been made showing the fine wire broken above the second bond.

FIG. 8 shows a good wire bond interconnection between first and second bond similar to FIG. 3, however, a small tail or extension 48 extends vertically upward from second bond. A condition of this type occurs when the wire breaks prematurely on rising to the tear height. Not only is the projection 48 undesirable but the length of tail 49 extending from the bonding tool 18 is probably too short to permit a proper ball to be formed thereon. The main bonder processor 28 senses that the break has occurred prematurely and the frequency of oscillator 11 has dropped to the free air reference line 43 prematurely. The main bonder processor 28 is programmed to immediately stop the bonding operation and permit the operator to correct the tail 49 and remove the projection 48 if necessary.

Figure 9:
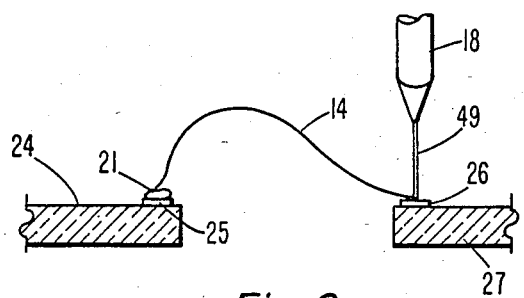
FIG. 9 is a schematic drawing of a capillary bonding tool after the second bond has been made showing the fine wire unbroken from the second bond.

FIG. 9, like FIG. 8, represents that a good fine wire interconnection 14 has been made between first and second bond and that the bonding tool 18 has risen to its predetermined tear height and no break has occurred between the wire the second bond at pad 26. When this condition occurs, the frequency of oscillator 11 has not dropped to the free air reference frequency 43 at the time it should have occurred The main bonder processor senses a failure to tear or a failure to tear properly because tail 49 is still connected to second bond 26. The main bonder processor 28 is preferably programmed to stop the bonding operation for proper operator attention.

Figure 10:
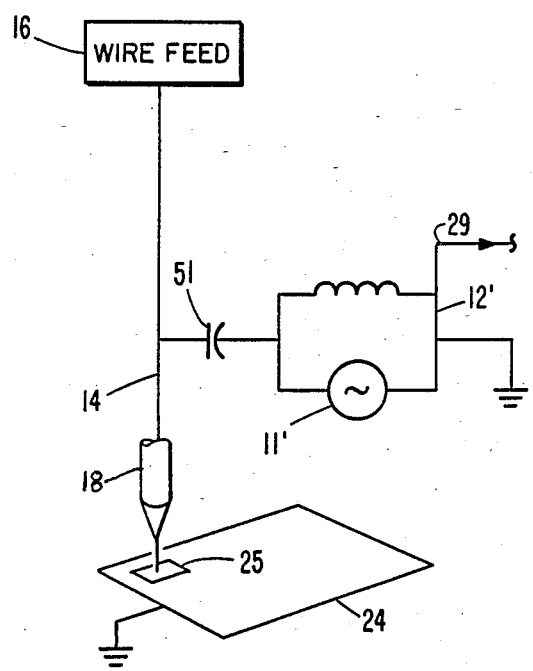
FIG. 10 is a schematic block diagram of a modification to FIG. 1 showing the high frequency oscillator being capacitively coupled to the fine wire.

Refer now to FIG. 10 which is a schematic block diagram of a modification of the preferred embodiment of FIG. 1 showing a high frequency oscillator 11' coupled by a capacitor 51 directly coupled to the fine wire 14. Oscillator 11' includes the inductive reactance winding 12' as well as the inherent capacitance and inductance in the lines and turns. With the exception that the second bond would also appear capacitive, the frequency of oscillator 11' is being changed as was explained herein before with reference to FIG. 2. Oscillator 11' may serve as the source of the frequency modulated signal to be fed to frequency sampler 31 via line 29. In this modified embodiment, the semiconductor 24 is preferably grounded or a.c. coupled to ground and the wire feed 16 is insulated from ground so that the current path is from the oscillator circuit to ground.

Having explained a preferred embodiment, wire bond monitoring system and a modification thereof, it will be appreciated that the present monitor is sensitive enough to detect all of the aforementioned problems as well as detecting discontinuities between one semiconductor device and another of the same type. If the ball 21 does not seat in the recess of the bonding tool 18 properly at first bond, a lower value capacitance and increased value in frequency can be detected. Since the preferred embodiment bond monitoring system can be programmed to generate frequency samples at least every millisecond, additional points on the time versus frequency curve shown in FIG. 2 may be programmed into the monitoring operation.

The preferred embodiment wire bond monitoring system shown in FIG. 1 is such that, the a.c. current applied to the semiconductor device is so small, that it will not harm very sensitive semiconductor devices of the type which cannot be monitored by prior art monitors. Further, it should be observed that the transformer core 13 shown in FIG. 1 may be mounted directly on the bonding head without engaging the fine wire 14. The oscillator 11 can also be mounted on the bonding head without modifying existing automatic wire bonders. These structural elements are so small and so stable that they can be placed on the bonding head proper without causing any structural modifications.

Grounding the wire feed 14 permits the use of multilayer wire on spools. Grounding or coupling the device to a reference voltage permits monitoring without reverse polarity or changing voltage when connections are made to sensitive pads or electrodes.

We claim:

1. A system for monitoring conditions of a fine wire bond interconnection as it is being made between a semiconductor device terminal and a lead out pad, comprising;

an automatic wire bonder of the type having a fine wire to be bonded extending through a wire guide of a bonding tool and the motion of said bonding tool being controlled by a bonding processor, a reference voltage connection on said semiconductor device to be bonded, a variable frequency oscillator coupled to said fine wire to be bonded, said oscillator frequency being varied by the changes in inductive and capacitive reactance in said fine wire as it is bonded to said semiconductor device and then to said lead out pad, sensing means coupled to said oscillator for providing digital data outputs proportional to said changes in frequency of said variable frequency oscillator, detector means coupled to said sensing means for processing and storing said digital data outputs from said sensing means, memory means in said bonding processor for storing a plurality of digital data outputs from said detector means representative of the frequency of said variable frequency oscillator at different times in a bonding operation for each of the fine wire bond interconnections to be made on a semiconductor device, comparison means in said bonding processor for comparing said digital data outputs from said detector means with the digital data stored in said memory means for determining if the fine wire bond interconnection being made by said automatic wire bonder conforms to the desired frequency digital data representation of good wire bond interconnections, and display means coupled to said bonding processor for indicating predetermined deviations from said digital data stored in said memory means representative of good fine wire bond interconnections.

2. A system for monitoring conditions of a fine wire bond interconnection as set forth in claim 1 which further includes a miniature transformer for coupling said variable frequency oscillator to said fine wire.

3. A system for monitoring conditions of a fine wire bond interconnection as set forth in claim 2 wherein said miniature transformer comprises a toroidal core and said fine wire extends through the central aperture of said toroidal core to provide a single turn secondary winding.

4. A system for monitoring conditions of a fine wire bond interconnection as set forth in claim 3 wherein said variable frequency oscillator comprises a plurality of turns on said toroidal core to provide a primary winding of said transformer.

5. A system for monitoring conditions of a fine wire bond interconnection as set forth in claim 1 wherein said sensing means comprises a counter coupled to said variable frequency oscillator, said oscillator being timed to count the output from said oscillator for a predetermined length of time.

6. A system for monitoring conditions of a fine wire bond interconnection as set forth in claim 5 wherein said detector means includes control means for determining if said fine wire is in contact with said reference voltage connection on said semiconductor device.

7. A system for monitoring conditions of a fine wire bond interconnection as set forth in claim 5 wherein said bonding processor is programmed to continuously update said stored digital data representative of the frequency of said fine wire while said fine wire is suspended in free air before contacting said reference voltage connection on said semiconductor device.

8. A system for monitoring conditions of a fine wire bond interconnection as set forth in claim 7 wherein said detector means is provided as part of the logic of said bonding processor.

9. A system for monitoring conditions of a fine wire bond interconnection as set forth in claim 1 wherein said variable frequency oscillator is capacitively coupled to said fine wire.

10. A system for monitoring conditions of a fine wire bond interconnection as set forth in claim 9 which further includes a wire feed for supplying said fine wire and said wire feed is insulated from said reference voltage connection on said semiconductor device.

11. A system for monitoring conditions of a fine wire bond interconnection as set forth in claim 1 wherein the peak to peak voltage in said fine wire is maintained below approximately 150 millivolts.

* * * * *